United States Patent
Farnworth et al.

(10) Patent No.: US 6,233,154 B1
(45) Date of Patent: May 15, 2001

(54) SINGLE-PIECE MOLDED MODULE HOUSING

(75) Inventors: Warren M. Farnworth, Nampa; Jerrold L. King, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/205,872

(22) Filed: Dec. 4, 1998

Related U.S. Application Data

(62) Division of application No. 08/705,533, filed on Aug. 29, 1996, now Pat. No. 5,892,660.

(51) Int. Cl.[7] .................................................. H05K 7/14
(52) U.S. Cl. .......................... 361/752; 361/741; 361/753; 361/801; 439/327; 439/377
(58) Field of Search .............................. 361/752, 756, 361/801, 802, 741, 753; 439/64, 76.1, 377, 327, 328; 211/41.17; 365/52

(56) References Cited

U.S. PATENT DOCUMENTS

| | | | |
|---|---|---|---|
| 3,662,224 | * 5/1972 | Rauch | 361/741 |
| 3,760,233 | * 9/1973 | Warwick | 361/753 |
| 3,932,016 | 1/1976 | Ammenheuser | 439/377 |
| 4,441,140 | * 4/1984 | Richard | 361/752 |
| 4,781,612 | 11/1988 | Thrush | 439/328 |
| 4,821,145 | 4/1989 | Corfits et al. | 361/692 |
| 4,832,619 | * 5/1989 | Eck et al. | 439/377 |
| 4,946,403 | 8/1990 | Billman et al. | 439/326 |
| 4,973,270 | 11/1990 | Billman et al. | 439/630 |
| 4,995,825 | 2/1991 | Korsunsky et al. | 439/328 |
| 5,026,297 | 6/1991 | Krehbiel | 439/326 |
| 5,030,115 | 7/1991 | Regnier et al. | 439/108 |
| 5,041,005 | 8/1991 | McHugh | 439/326 |
| 5,109,318 | 4/1992 | Funari et al. | 361/710 |
| 5,209,675 | 5/1993 | Korsunsky | 439/326 |
| 5,216,578 | 6/1993 | Zenitani et al. | 361/690 |
| 5,244,403 | 9/1993 | Smith et al. | 439/326 |
| 5,254,017 | 10/1993 | Tondreault et al. | 439/637 |
| 5,256,078 | 10/1993 | Lwee et al. | 439/326 |
| 5,302,133 | 4/1994 | Tondreault | 439/157 |
| 5,366,390 | 11/1994 | Kinross et al. | 439/636 |
| 5,387,115 | 2/1995 | Kozel et al. | 439/157 |
| 5,397,857 | 3/1995 | Farquhar et al. | 174/52.1 |
| 5,420,751 | 5/1995 | Burns | 361/707 |
| 5,423,691 | * 6/1995 | Pickles | 439/327 |
| 5,429,523 | 7/1995 | Tondreault | 439/157 |
| 5,436,203 | 7/1995 | Lin | 29/841 |
| 5,463,531 | 10/1995 | Choon et al. | 361/737 |
| 5,469,332 | 11/1995 | Alvite | 361/737 |
| 5,475,919 | 12/1995 | Wu et al. | 29/841 |
| 5,481,434 | 1/1996 | Banakis et al. | 361/756 |
| 5,490,891 | 2/1996 | Farquhar et al. | 156/73.1 |
| 5,642,263 | * 6/1997 | Lauruhn | 361/801 |
| 5,726,865 | * 3/1998 | Webb et al. | 361/801 |
| 6,007,357 | * 12/1999 | Perino et al. | 439/327 |

OTHER PUBLICATIONS

Microelectronics Packaging Handbook; 1989; pp. 760–771.
Electronic Materials Handbook vol. 1 Packaging; 1989; pp. 802–824.

* cited by examiner

Primary Examiner—Jeffrey Gaffin
Assistant Examiner—John B. Vigushin
(74) Attorney, Agent, or Firm—Trask Britt

(57) ABSTRACT

An adapter or housing for a module, such as a single in-line memory module (SIMM) or the like, and method of using the same are herein disclosed where the SIMM and attached housing fit a predetermined shape SIMM socket. The housing replaces SIMM board material that would otherwise be used to help secure the SIMM to a predetermined shape SIMM socket or connector. The configuration of the housing allows a SIMM or the like to be snapped or slid and secured into the housing. If desired, an adhesive, potting material and other bonding material can be used to secure the SIMM board to the housing and/or pot the SIMM within the housing.

42 Claims, 11 Drawing Sheets

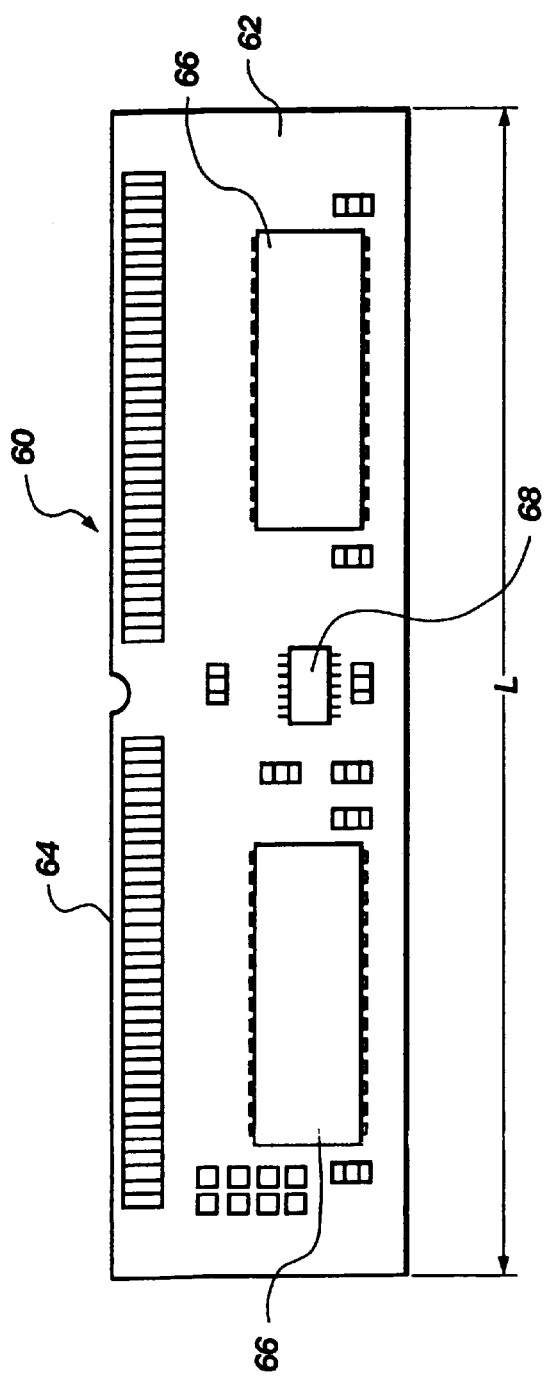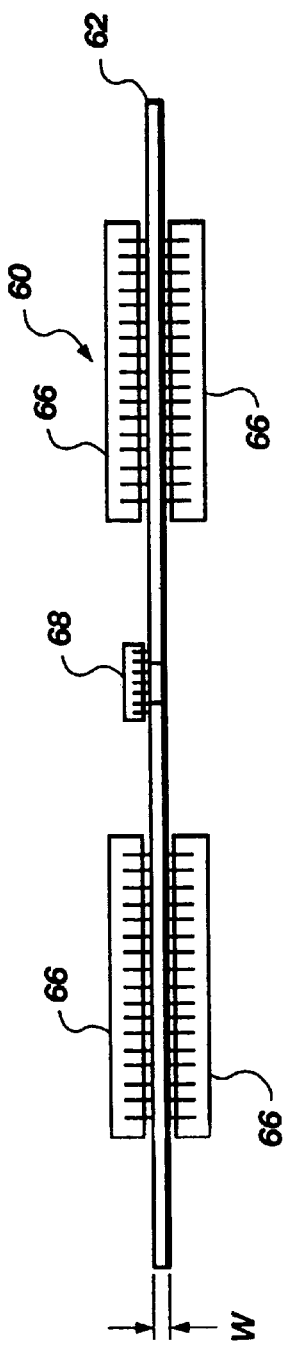
Fig. 3A
Fig. 3B

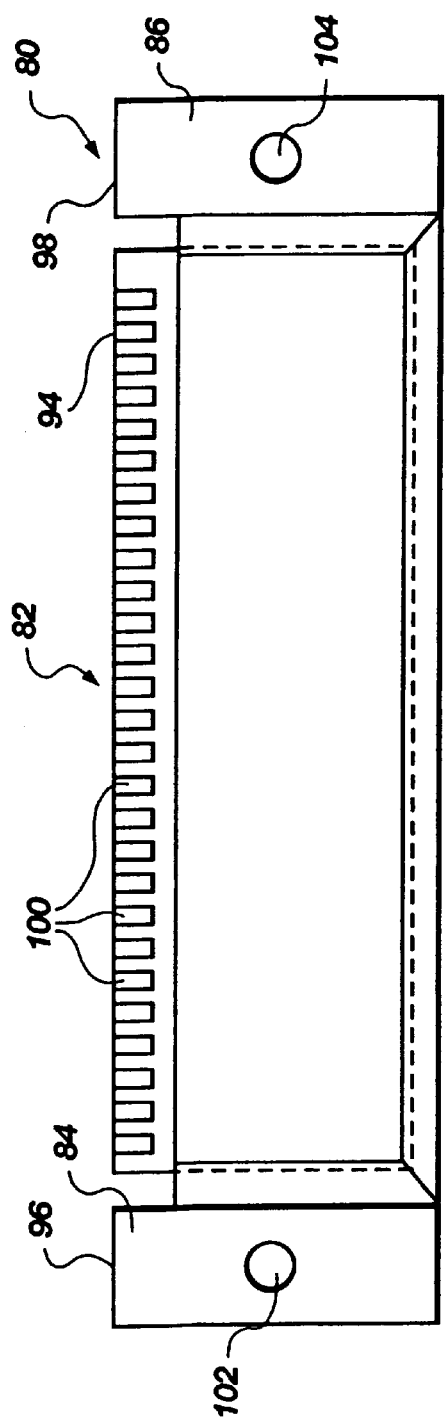
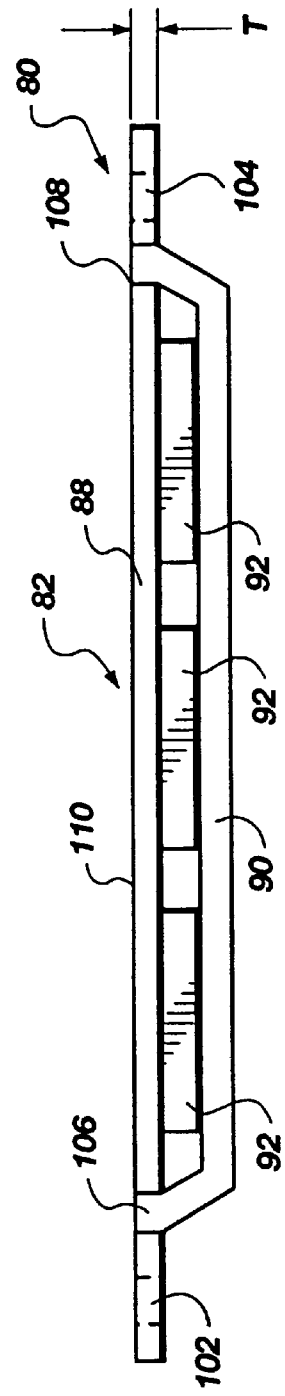
Fig. 6A
Fig. 6B

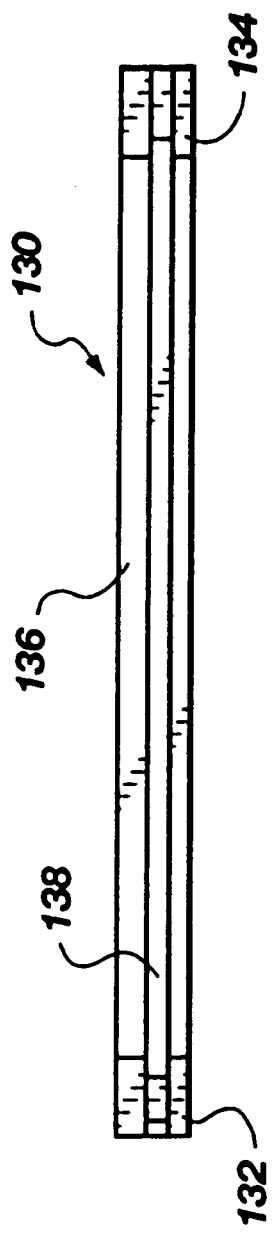
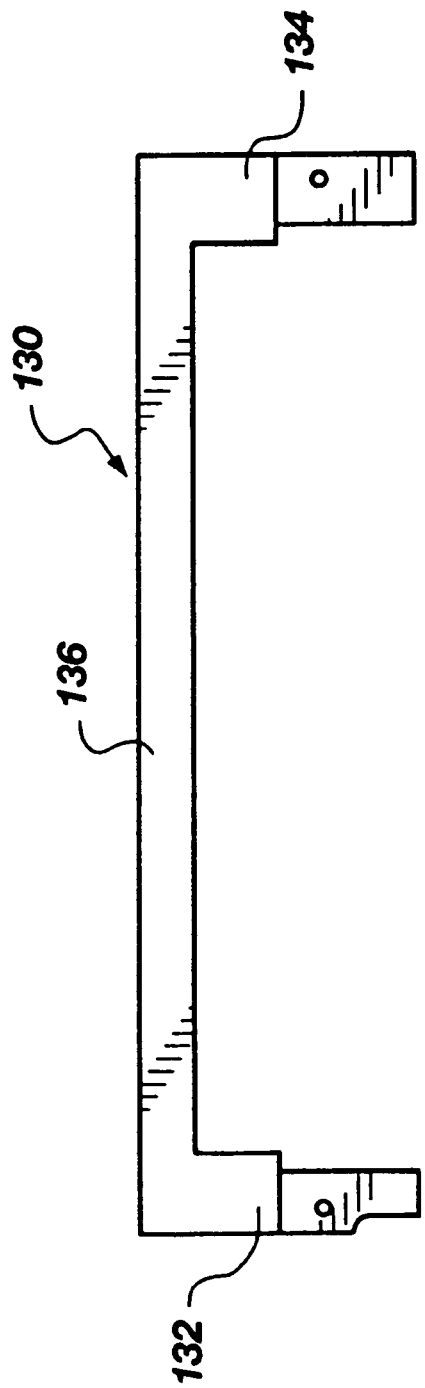
Fig. 8A
Fig. 8B

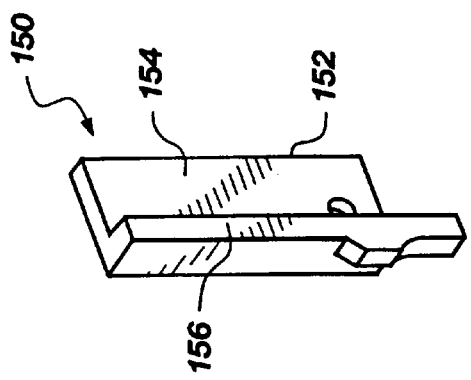
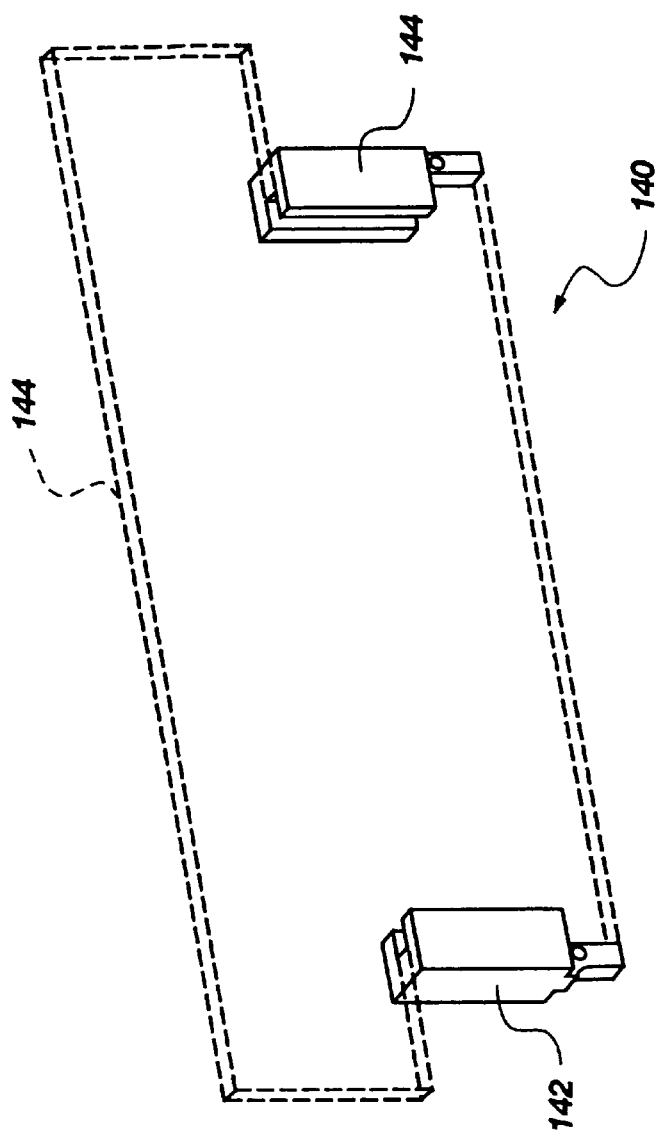

SINGLE-PIECE MOLDED MODULE HOUSING

CROSS REFERENCE TO RELATED APPLICATION

This application is a divisional of application Ser. No. 08/705,533, filed Aug. 29, 1996, now U.S. Pat. No. 5,892,660.

BACKGROUND OF THE INVENTION

1. Field of the Invention

This invention relates generally to modules used in computers, such as single in-line memory modules (SIMMs) and the like. More specifically, the present invention relates to a SIMM housing including a smaller printed circuit board to form a standard outline module.

2. State of the Art

An integrated circuit (IC) typically includes a semiconductor die (die) electrically attached to a lead frame providing physical support for the die and connecting the die to external circuitry, such as a printed circuit board. In such an arrangement, the lead frame and die are connected by forming wire bonds between the lead fingers of the lead frame and the bond pads located on a surface of the die. The die and lead frame are then typically encapsulated within a plastic package, although ceramic and metal packages may also be used, depending on the operating environment and the packaging requirements of the die.

As the demand for memory, in particular random access memory (RAM), surpassed the memory capability of a single die, multi-chip modules (MCMs) were developed having a number of memory devices attached to a single substrate, such as a printed circuit board. A single in-line memory module (SIMM) is a multi-chip memory module having multiples of the same basic die, where the semiconductor memory chips are aligned in a row and interconnected to a printed circuit board to, in effect, create a single device with the memory capacity of the combined memory chips. Internal circuitry of the printed circuit board connects each chip to terminals attached along one edge of the printed circuit board. The terminals are configured for attachment to an edge-type connector, such as a SIMM socket as is known in the art. As the demand for additional memory on a single device has increased, other devices, such as a dual in-line memory module (DIMM), have also been developed. Such devices, while providing the desired memory capability on a single printed circuit board, are relatively expensive to manufacture, requiring manufacture and/or purchase of relatively expensive components.

As an increase in supply of SIMMs in the marketplace has dropped the price of RAM, an even greater need to decrease the cost of manufacturing SIMMs exists. Because of advances in chip manufacturing technology and efficiency, manufacturers can produce thousands of chips per day. With such high volume production rates, small improvements in efficiency and/or cost reduction per chip can make substantial differences in the daily cost of manufacturing. While manufacturers have continued to streamline processes to improve efficiency and decrease production costs, the amount of materials used to form many standard components has remained relatively constant.

One of the components of a SIMM is a printed circuit board, typically comprised of a fire-retardant, epoxy resin/glass cloth laminate, commonly referred to as FR-4. The epoxy resin used in the formation of the FR-4 board is typically diglycidyl ether of 4,4'-bis(hydroxyphenyl) methane, or other low-molecular weight polymers of it. Fire retardancy is imparted by including enough tetrabromobisphenol-A to provide 15% to 20% bromine content. Sometimes, about 10% of higher functionality epoxy is added to raise the glass transition point and improve chemical resistance of the resin by increasing cross-link density.

Other materials used in the manufacture of FR-4 boards include curing agents such as dicyandiamide (DICY) and catalysts such as tertiary amines. DICY has low solubility in common organic solvents, so that the full stoichiometric capability for linking the epoxy-bond network is not used. The molding flow is suited for multi-layer laminating needed for printed circuit boards, and the cured physical properties are good with strain to fracture ratio of about 0.04, thereby providing enough resiliency for good metal or glass bond interfaces.

While FR-4 is the preferred material for the SIMM board, it is a relatively expensive part of the SIMM and can account for a substantial portion of the cost of the entire SIMM. Other high-performance boards based on such high glass-transition-temperature materials, such as polyamide-glass or cyanate-glass, may also be used, but are substantially more expensive than FR-4. In addition to the cost of materials, the care necessary to ensure an aesthetically pleasing component requires special attention to be paid to the quality of workmanship. This additional care may require more detailed or additional inspection of each component and slow the rate of production.

It is known in the art to provide containers for "plug-in" peripheral cards in the form of printed circuit boards contained within an exterior package. These devices are termed "PCMCIA style peripheral devices" (PCMCIA being the acronym for Personal Computer Memory Card International Association) and are designed to be plugged-in and removed by the user. Hence, the cards are typically housed within a metal case that protects the memory devices contained therein from being physically contacted and/or damaged by the user or environment. Such a device is illustrated in U.S. Pat. No. 5,397,857 to Farquhar et al.

SIMMs, on the other hand, are not typically housed and, as previously described, are simply printed circuit boards having a row of memory chips attached thereto and a row of connectors along one edge. While typically being removably attached to a computer card, SIMMs tend to remain untouched once installed in a computer unless the amount of memory is changed by adding to or replacing one or more SIMMs.

An exception to a conventional SIMM configuration is taught in U.S. Pat. No. 5,109,318 to Funari et al. As described in U.S. Pat. No. 5,109,318, a housing for a conventional SIMM serves as a heat sink. Such a heat sink housing would add to the cost of the finished SIMM.

Therefore, a need exists for the fabrication of less costly SIMMs and the like by reducing the quantity of material used to make the SIMM board while allowing the SIMM to be mounted to an industry-standard SIMM socket. In addition, the ability to cover the SIMM and any aesthetic anomalies thereon has the added benefit of speeding the production rate of SIMMs.

SUMMARY OF THE INVENTION

Accordingly, a module, such as a single in-line memory module (SIMM) or the like is provided comprised of a SIMM board and a SIMM holder or adapter configured to mate with a predetermined configuration SIMM socket. The adapter, preferably made of a single-piece molded plastic, houses a reduced-size SIMM board, effectively replacing a portion of the board material with a less-expensive adapter material. Such a SIMM, while compatible with SIMM sockets known in the art, requires less board material and is less expensive to produce than conventional SIMMs.

In a preferred embodiment, a module, such as a SIMM holder or adapter, includes two memory board retaining members, each having a substantially longitudinally extending slot sized and shaped to receive and secure a memory board such as a printed circuit board. The retaining members are also configured to be at least partially received within a standard SIMM socket as is known in the art. That is, a portion of each retaining member fits into the SIMM socket to occupy the space that would otherwise be filled by a conventional SIMM board. In other words, the portion of the retaining member that fits in the SIMM socket fills the gap or gaps between the end or ends of the SIMM socket and the reduced-size SIMM board and helps to align the reduced-size SIMM board relative to the socket.

In another preferred embodiment, the retaining members are held in relative relation to one another by a cross-member depending from and extending between the retaining members. The cross member preferably includes a longitudinally extending groove or slot sized and shaped to receive the top edge of a module board. Thus, the cross-member and its associated retaining members form a C-shaped adapter that can hold a module board therein.

In yet another preferred embodiment, the SIMM socket adapter according to the present invention is in the form of a housing having two retaining members and at least one longitudinally extending wall extending from one retaining member to the other. Such a wall covers at least a portion of the SIMM board and provides structural strength for the adapter. A SIMM board positioned within the housing can be potted as is known in the art. Thus, the need to ensure that the SIMM board and the chips and other components located thereon are aesthetically pleasing is not necessary.

In yet another preferred embodiment, the SIMM socket adapter includes two socket connectors attached to and separated by a module housing. The module housing may include only one side wall, in which case at least one protrusion or retaining portion on each side of the board may be needed to secure the board to the adapter, or may include side walls on both sides of the module board, in which case the board becomes essentially "sandwiched" between the two side walls. In either case, the board and any components thereon can be potted by methods known in the art.

BRIEF DESCRIPTION OF THE DRAWINGS

FIGS. 3A and 3B are schematic views of a reduced-size SIMM sized to fit within the SIMM adapter of FIG. 2;

FIGS. 6A and 6B are schematic drawings of a third embodiment of a SIMM adapter according to the present invention;

FIGS. 8A and 8B are schematic drawings of a fifth embodiment of a SIMM adapter according to the present invention;

FIG. 9 is a perspective view of a sixth embodiment of a SIMM adapter according to the present invention;

FIG. 10 is a perspective view of a seventh embodiment of a SIMM adapter according to the present invention;

DETAILED DESCRIPTION OF THE ILLUSTRATED EMBODIMENT

Figure 1:
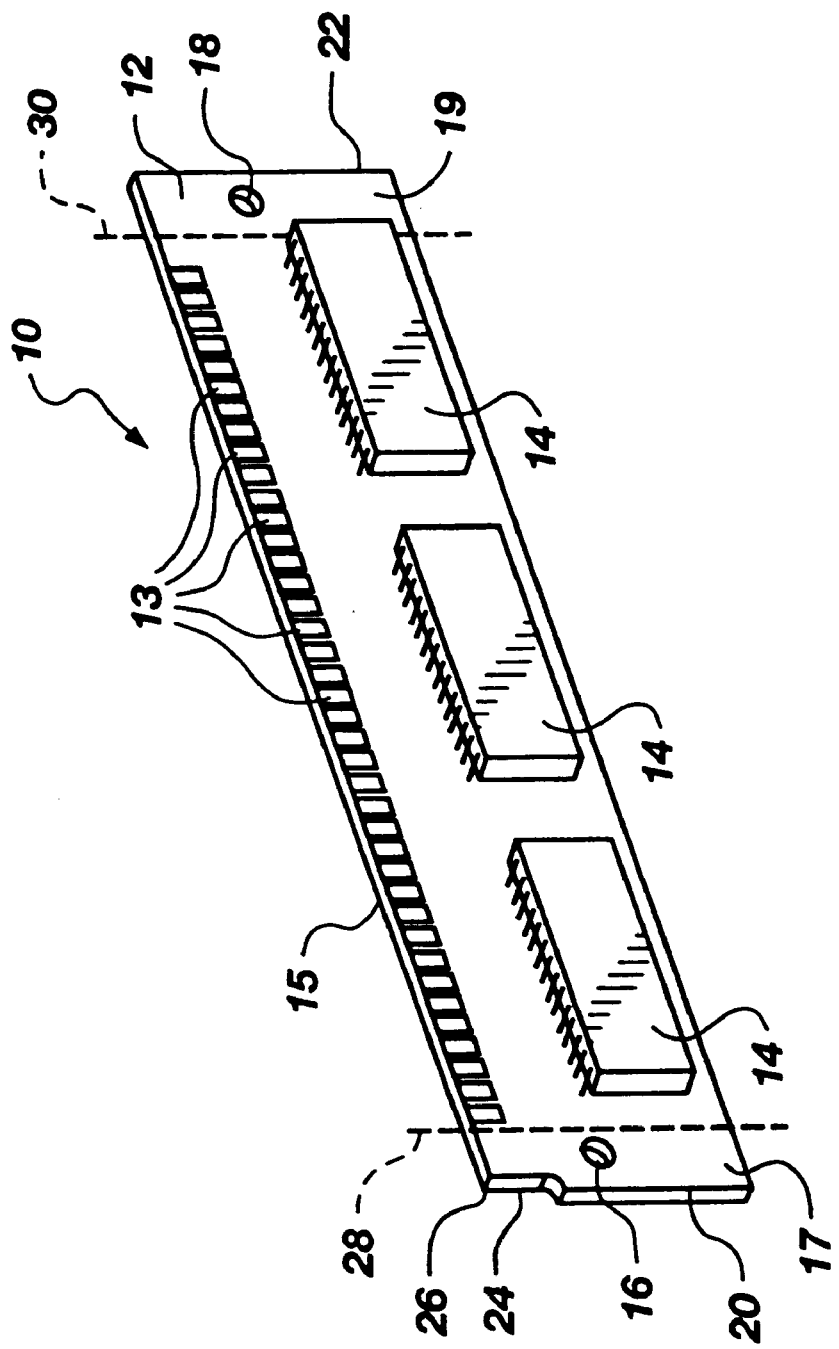
FIG. 1 is a perspective view of a prior art SIMM.
Figure 2:
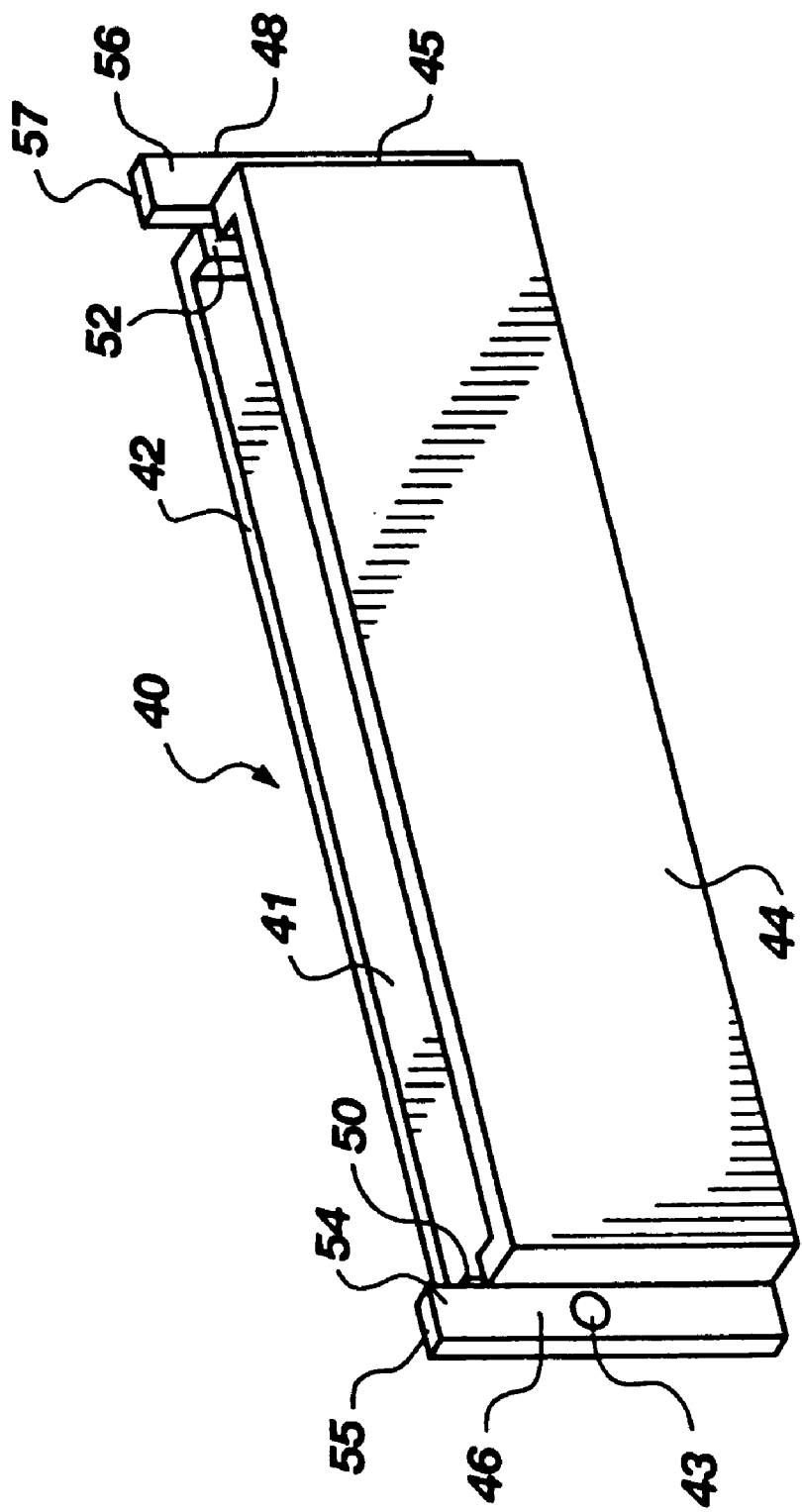
FIG. 2 is a perspective view of a first preferred embodiment of a SIMM adapter according to the present invention.

Referring to FIG. 1, a prior art, single in-line memory module (SIMM) 10 is illustrated and comprised of a module board 12, typically a printed circuit board, with a plurality of semiconductor devices 14 attached thereto. In a SIMM, each of the semiconductor devices 14 are usually the same type and size and arranged in a row longitudinally across the printed circuit board 12. The printed circuit board 12 is generally rectangular in shape and has a row of contacts 13 along a bottom edge 15 of the board 12. The printed circuit board 12 also includes holes 16 and 18 proximate each end 20 and 22 of the board 12, respectively, and a J-shaped notch 24 on the corner 26 of the board 12 to assist alignment of the contacts 13 with a SIMM socket or connector as is known in the art. As illustrated by dashed lines 28 and 30, the printed circuit board 12 material, typically FR-4, between the dashed line 28 and the end 20 and between the dashed line 30 and the end 22 is merely used to attach and align the SIMM 10 to a SIMM socket, and could be eliminated from the SIMM 10 without any loss of functionality. In order to properly attach and align the SIMM 10 to an industry standard SIMM socket, however, without the use of the adapter according to the present invention, the portions 17 and 19 of the board 12 extending beyond the lines 28 and 30 are needed.

Referring now to FIGS. 2, 3A, 3B, and 4, a first preferred embodiment of an adapter or housing 40 according to the present invention is illustrated. The housing 40, generally a rectangular box shape, is comprised of a first side wall 42 and a second side wall 44 depending from and extending between a first connector or retaining member 46 and a second connector or retaining member 48. The walls 42 and 44 and the connectors 46 and 48 of the housing 40 form a chamber 41 into which a SIMM 60 or the like can be inserted (see FIGS. 3A and 3B), the walls 42 and 44 being separated a distance sufficient to allow clearance for the SIMM 60 and any chips 66 or components 68 thereon. The walls 42 and 44 may also include holes 43 and 45 and other features of a conventional SIMM 10 so that the housing 40 and the SIMM 60 therein properly fit within a SIMM socket as known in the art.

Figure 4:
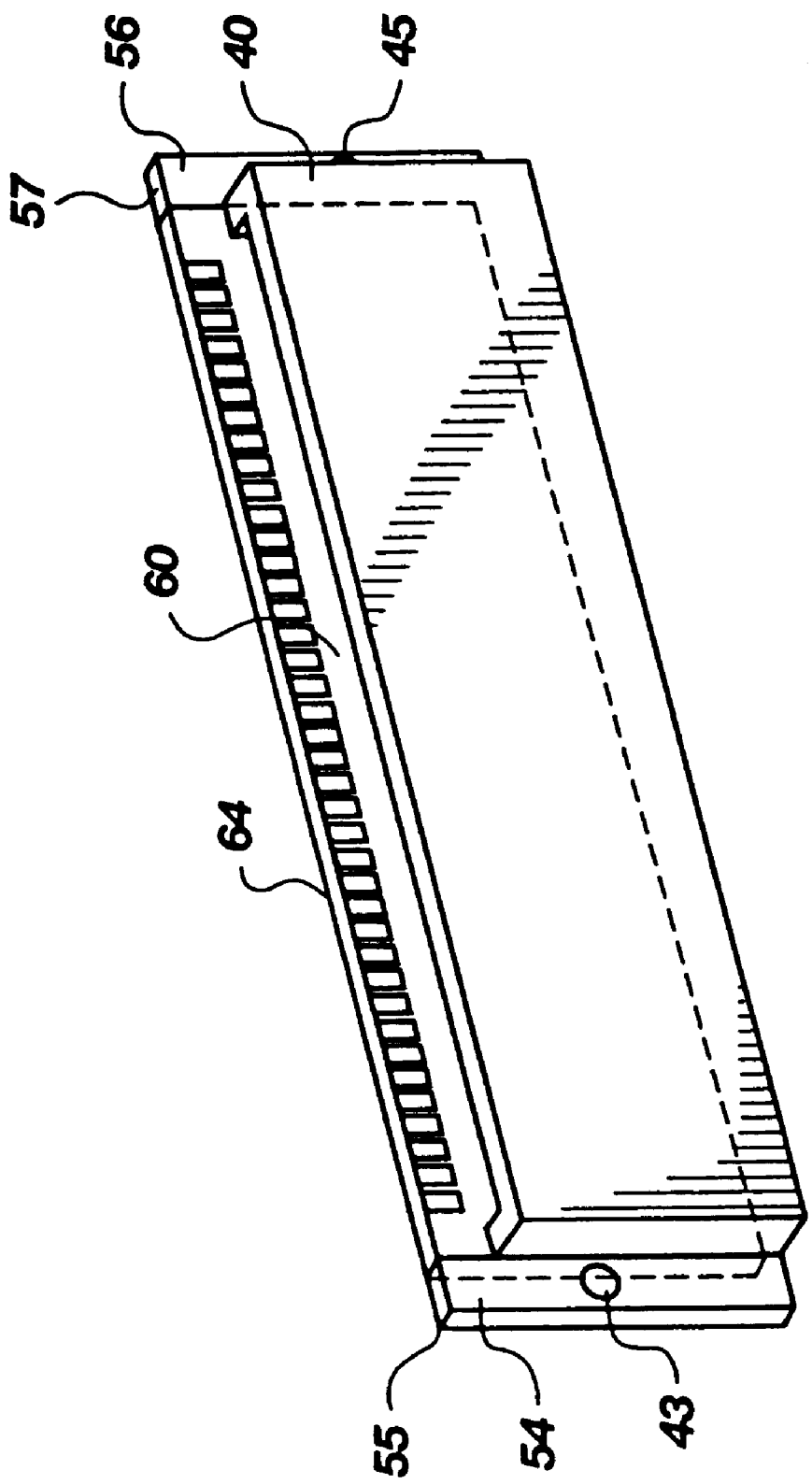
FIG. 4 is a perspective view of the SIMM of FIGS. 3A and 3B inserted into the SIMM adapter of FIG. 2.

To keep a SIMM 60 or the like securely positioned within the chamber 41, the connectors 46 and 48 define slots 50 and 52, respectively, that longitudinally extend along a length of each connector 46 and 48. The slots 50 and 52 are sized and spaced from one another so that a SIMM board 62 fits snugly therein. In addition, the connectors 46 and 48 include extended portions or tabs 54 and 56, respectively, that are aligned with and generally the same width as the slots 50 and 52, and thus generally the same width W as the SIMM board 62. As shown in FIG. 4, when the SIMM 60 is properly inserted into the housing 40, the tabs 54 and 56 extend substantially the same distance as the bottom edge 64 of the SIMM 60 so that the end surfaces 55 and 57 of the tabs 54 and 56, respectively, are substantially flush with the bottom edge 64. If desired, once the SIMM 60 is properly inserted, any spaces between the SIMM 60 and the inside of the housing 40 could be potted or otherwise filled with a potting or other compound known in the art to ensure that the SIMM 60 remains fixed to the housing 40.

Figure 5:
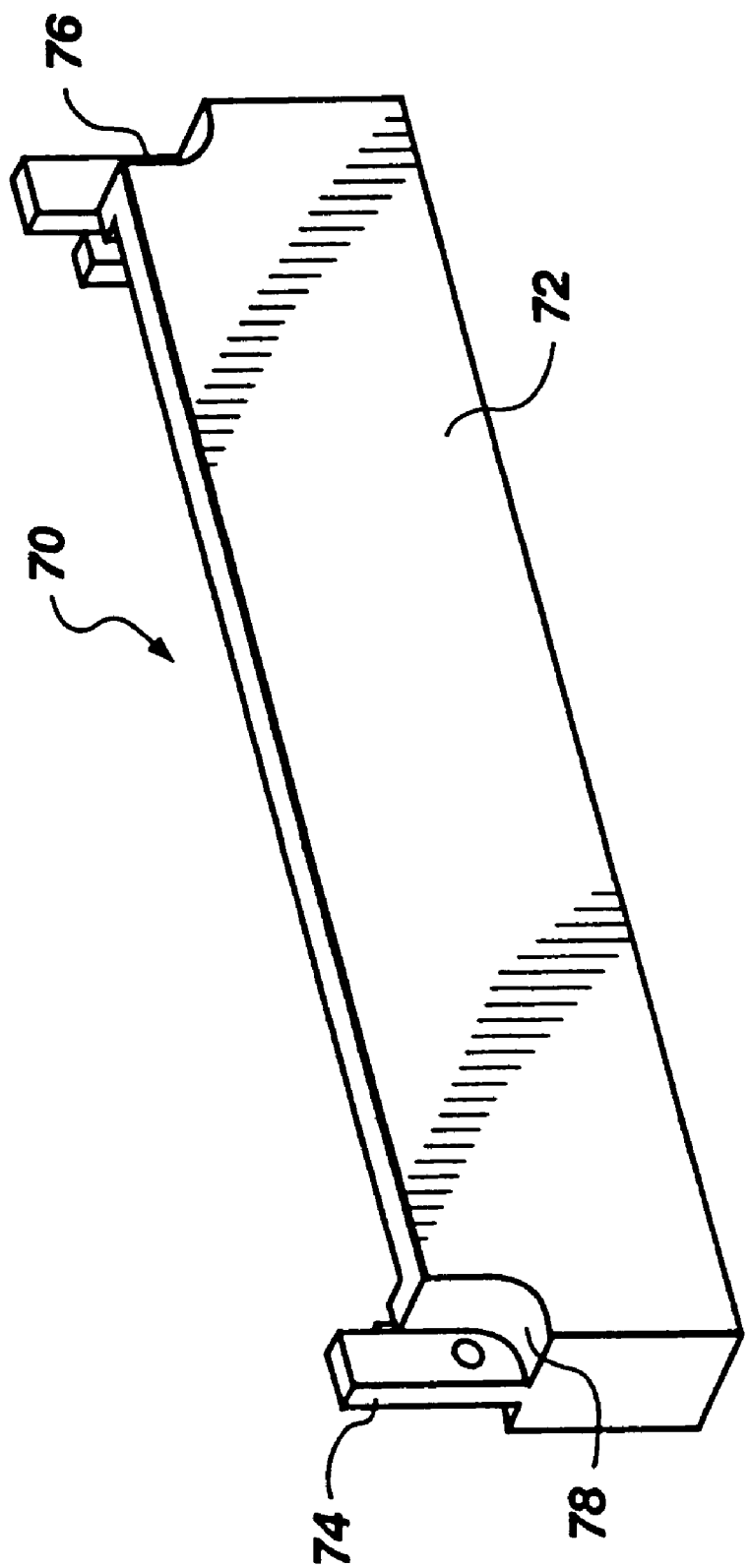
FIG. 5 is a perspective view of a second embodiment of a SIMM adapter according to the present invention.

Referring now to FIG. 5, another preferred embodiment of a holder or adapter 70 according to the present invention is illustrated. This embodiment is similar to the housing 40 of FIG. 2 but has only one side wall 72 extending between the end portions or connectors 74 and 76. Thus, a SIMM such as SIMM 10, with portions 17 and 19 removed, can be inserted therein with the semiconductor devices 14 facing the inside of the side wall 72, or inserted with the semiconductor devices 14 being exposed. Preferably, the semiconductor devices 14 face the inside of the side wall 72 so that any aesthetic anomalies on the SIMM 10 are covered by the side wall 72. In addition, a J-shaped recess 78 may be incorporated in the connector 74 to substantially duplicate the configuration of the SIMM 10 for proper seating of the adapter 70 and SIMM 10 within a conventional SIMM socket. Moreover, as with the housing 40, any spaces between the SIMM 10 and the inside of the side wall 72 can be potted or otherwise filled with other materials known in the art.

To illustrate that the present invention has applicability to various memory modules, the SIMM 60 of FIGS. 3A and 3B is of a different configuration than the SIMM 10 of FIG. 1, SIMM 10 being an older type conventional SIMM and the SIMM 60 being a more current SIMM version. Unlike the SIMM 10 of FIG. 1, however, SIMM 60, while otherwise having a conventional configuration, does not have the same length L as the conventional SIMM 10, (i.e., not including the portions 17 and 19 of the SIMM 10 illustrated in FIG. 1). By reducing the size or length L and thus the amount of material necessary to form the SIMM board 62, the overall cost of manufacturing the SIMM 60 is decreased. However, to connect and properly align such a reduced-size SIMM 60 to a conventional SIMM socket, as known in the art, the SIMM 60 can employ the adapter 40 of the present invention, preferably made of a less expensive material than the material used to form the SIMM board 62. Thus, the adapter 40 may be comprised of a single-piece molded plastic housing, or formed of other materials known in the art.

In yet another preferred embodiment of the present invention, an adapter 80 and SIMM 82 is illustrated in FIGS. 6A and 6B. The adapter 80 is comprised of two connectors or end portions 84 and 86 having a thickness T substantially equal to a thickness of the SIMM board 88 of the SIMM 82. A C-shaped side wall 90 extends between and depends from the end portions 84 and 86 and substantially covers chips 92 of the SIMM 82. The end portions 84 and 86 extend a distance beyond the side wall toward the bottom edge 94 of the SIMM board 88 so that the edges 96 and 98 of the end portions 84 and 86, respectively, are substantially longitudinally flush with the bottom edge 94. Thus, the side wall 90 is set back a distance from the bottom edge 94 to expose the connectors 100 of the SIMM 82. The SIMM board 88 is held in relation to the adapter 80 by retaining portions or protrusions 106 and 108 that extend over a portion of the back surface 110 of the SIMM board 88. Thus, to assemble the SIMM 82 to the adapter 80, the SIMM 82 can simply be snapped into the adapter 80. As with other preferred embodiments herein described, the adapter 80 can include holes 102 and 104 and other features of conventional SIMM boards.

Figure 7:
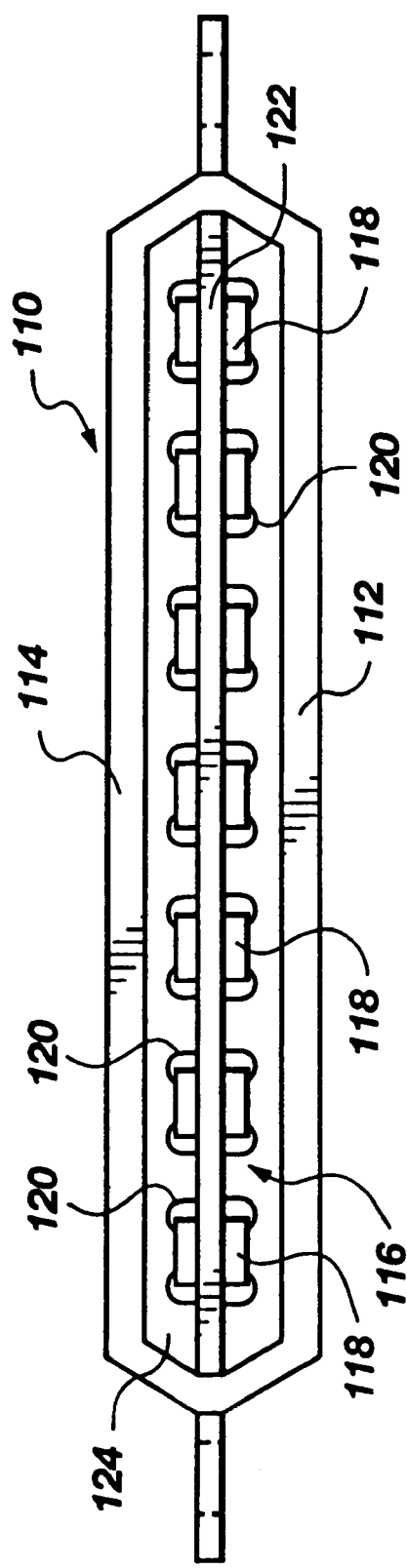
FIG. 7 is a schematic drawing of a fourth embodiment of a SIMM adapter according to the present invention.

FIG. 7 is another preferred embodiment of an adapter 110 similar to the adapter 80 shown in FIGS. 6A and 6B, but having a pair of C-shaped side walls 112 and 114 housing a SIMM 116. As with other embodiments described herein, because the adapter 110 substantially encloses the SIMM 116 and thus protects the components of the SIMM 116, it is not necessary to provide packaged chips on the SIMM 116 as is typically done with conventional SIMMs. Thus, individual dice 118 can be wire bonded 120 to the SIMM board 122 as shown or flip-chip bonded to the board 122 as is known in the art. The chamber 124 can then be filled with a potting or other material known in the art to form a hermetic or near hermetic seal around the dice 118.

FIGS. 8A and 8B illustrate yet another preferred embodiment of an adapter 130 that is comprised of two end retaining members 132 and 134 similar to other embodiments herein described. The retaining members 132 and 134 of this embodiment, however, are held in relative relation to one another by a slotted or channeled cross-member 136. The adapter 130 thus fits around at least a portion of the perimeter of a SIMM, such as SIMM 60, and will properly align the SIMM 60 to a SIMM socket known in the art. If desired, an adhesive or other bonding material can be inserted into the slot 138 to hold the adapter 130 onto the SIMM 60.

In FIG. 9, the adapter 140 may simply be comprised of two connectors or retaining members 142 and 144. The retaining members 142 and 144 form an adapter 140 similar to the adapter of FIGS. 8A and 8B but without the cross-member 136. Further illustrated in FIG. 9 is the use of a T-shaped board represented by dashed lines 144. Thus, the present invention can be adapted to be used in conjunction with various boards and board configurations.

FIG. 10 illustrates an adapter 150 similar to the connector 142 of the adapter 140 shown in FIG. 9. The adapter 150 is comprised of a single connector 152 that may be adhesively or otherwise attached to a SIMM board and is configured to resemble the portion of a conventional SIMM board that it is replacing. Preferably, an adhesive or other bonding material is applied to at least a portion of surface 154 and the surface 154 is attached to the back of a SIMM board with abutment portion 156 abutting the side of the SIMM board. If only one side of a SIMM board is being replaced, then only one connector 152 is needed. A similar adapter, however, could be used for the opposite side of the SIMM board.

Figure 11:
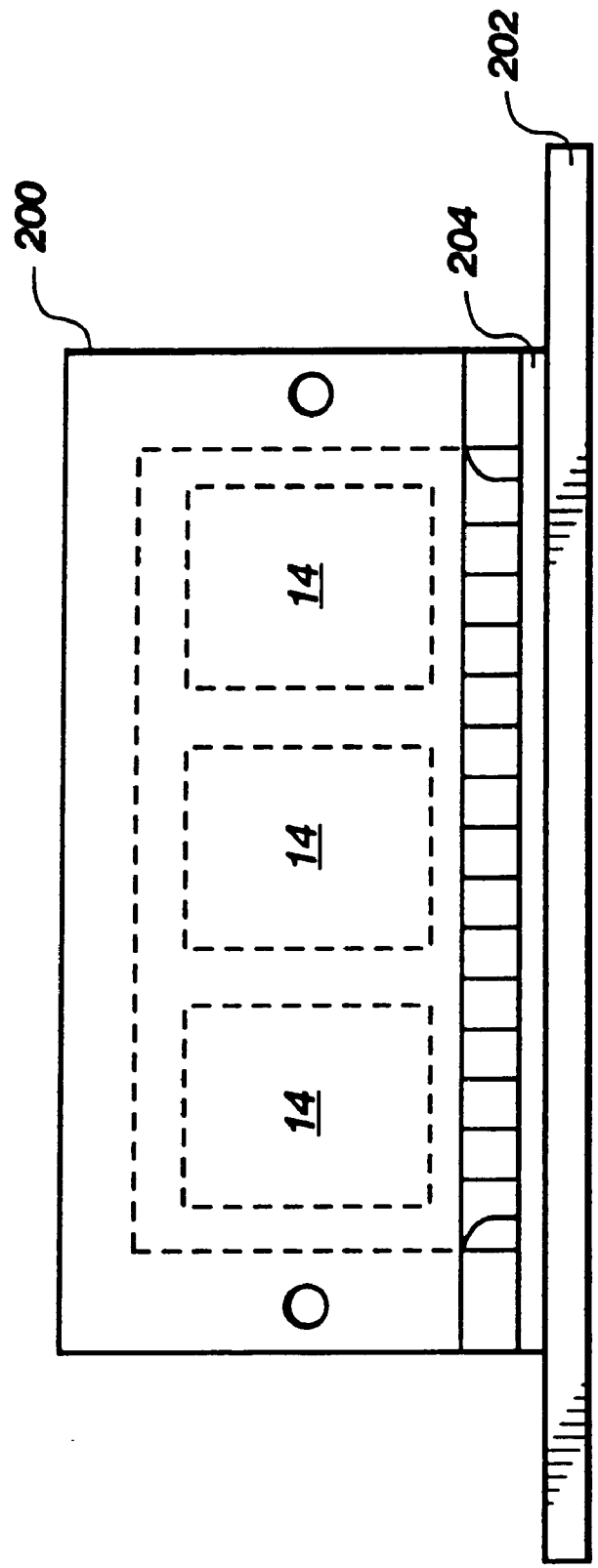
FIG. 11 is a side view of a general illustration of the SIMM adapter of the present invention connected to another circuit board.

FIG. 11 generally illustrates the module adapter 200 of the present invention installed on another circuit board 202 having a connector 204 therein. The module adapter 200 illustrates the various embodiments of the present invention shown in drawing FIGS. 2 through 10 set forth and described hereinbefore wherein the module adapter comprises either an adapter housing 40, an adapter 70 comprising a housing having only one side wall 72 extending between the end portions or connectors 74 and 76, an adapter 80 comprised of two connectors or end portions 84 and 86, an adapter 110 having a pair of C-shaped side walls 112 and 114, an adapter 130 comprising retaining members 132 and 134 held in relative relation to one another by a slotted or channeled cross-member 136, an adapter 140 comprised of two connectors or retaining members 152 and 144, or an adapter 150 comprised of a single connector 142 attached to a portion of a SIMM board.

Figure 12:
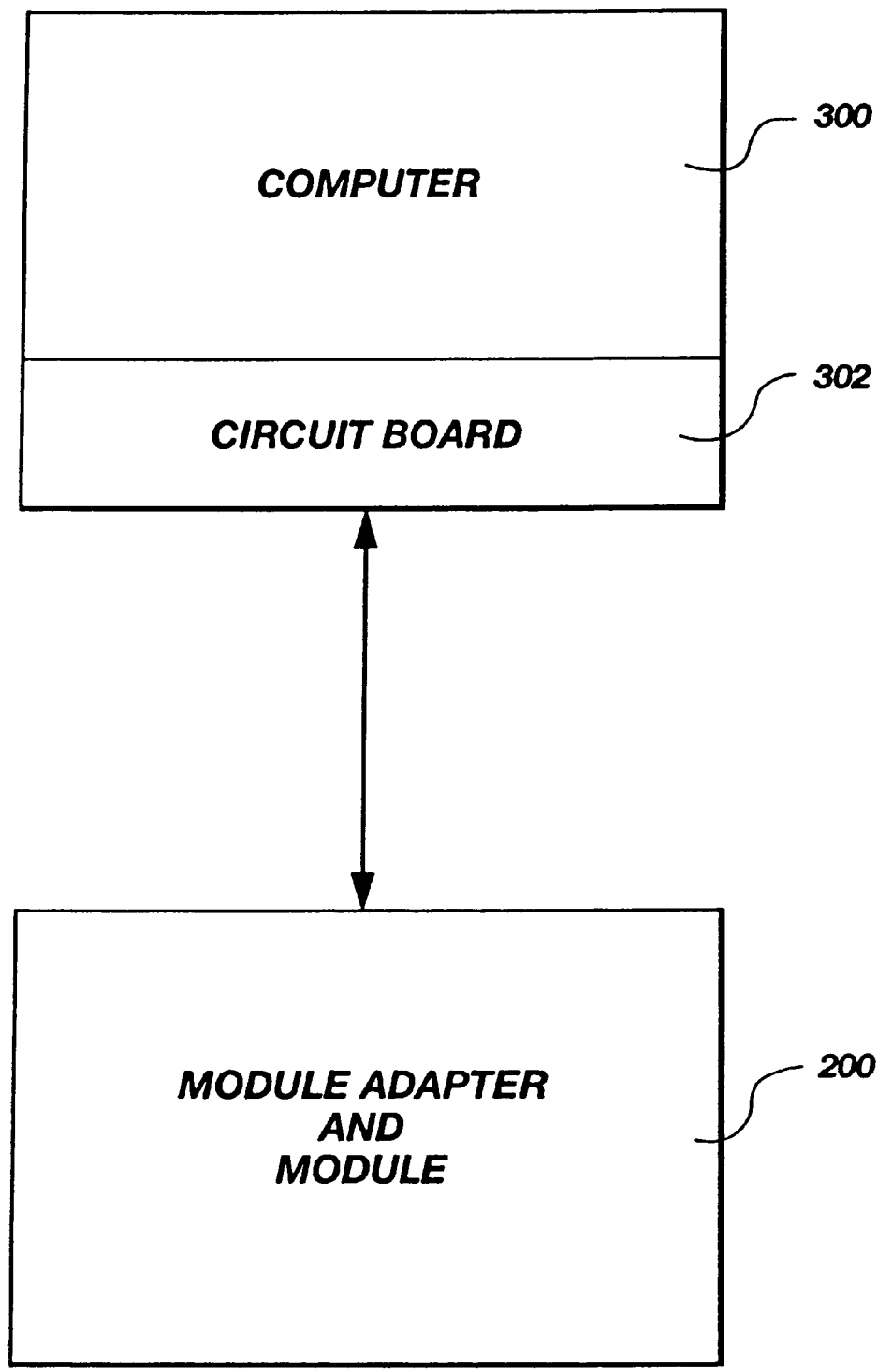
FIG. 12 is a view of a module and module adapter of the present invention in conjunction with a computer.

Referring to drawing FIG. 12, the module and module adapter 200 is shown in conjunction with a computer 300 being connected to a circuit board 302 therein. In this manner, a module and module adapter 200, the module having a variety of components therein, can be connected to any circuit board 302 of a computer 300 for use therewith.

In addition to the embodiments illustrating adapters formed from single-piece molded plastics and the like, it will be appreciated by those skilled in the art that separate components and/or component material could be combined to form such an adapter. Moreover, it will be appreciated by those skilled in the art that variously configured memory modules could be benefitted by the adapters of the present invention. Further, while the invention has been described with relation to memory devices, the invention may be practiced on many other multi-chip modules where it is desirable to save printed circuit board or other substrate material.

It should be noted that the term "SIMM" as used in the specification and appended claims is intended as exemplary and not limiting, the invention having applicability to any multi-chip module. In addition, while preferred embodiments were illustrated as having packaged dice attached to the SIMM board, the invention makes possible the use of bare dice that are wire bonded, flip-chip bonded, or otherwise connected to the substrate.

It will also be appreciated by one of ordinary skill in the art that one or more features of any of the illustrated embodiments may be combined with one or more features from another to form yet another combination within the scope of the invention as described and claimed herein. For example, each of the adapters could be L-shaped to secure a portion of the top edge and sides of the module board. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A module adapter for connecting a module board having a plurality of sides to a module socket of another board, said module adapter comprising:
    a first connector for connection to a first side of said plurality of sides of said module board, said first connector configured to be at least partially received in said module socket of said another board;
    a second connector for connection to a second side of said plurality of sides of said module board, said second connector configured to be at least partially received in said module socket of said another board, said first connector and said second connector being structured unitarily.

2. The module adapter of claim 1, further including:
    a cross-member depending from and extending between said first and second connectors.

3. The module adapter of claim 2, wherein said cross-member includes a longitudinally extending slot configured to receive a top edge of said module board.

4. The module adapter of claim 1, further including:
    a first side wall depending from and extending between said first and second connectors, said first side wall at least partially exposing said module board contained within said module adapter for attachment of said module board to said module socket of said another board; and
    at least one retaining member on each of said first and second connectors for retaining said module board to said module adapter.

5. The module adapter of claim 4, wherein said at least one retaining member substantially longitudinally extends along a length of each of said first and second connectors.

6. The module adapter of claim 4, wherein said at least one retaining member includes at least one protrusion.

7. A module adapter connecting a module board having a plurality of sides to a module socket of another board, said module adapter comprising:
    a holder configured to be at least partially received in said module socket of said another board, said module board positioned within said holder, said holder including a first connector attached to a first side of said module board and a second connector attached to a second side of said module board, said first connector and said second connector being structured unitarily; and
    at least one chip attached to said module board.

8. The module adapter of claim 7, wherein said holder includes:
    at least one cross-member depending from and extending between said first connector and said second connector.

9. The module adapter of claim 8, wherein said at least one cross-member includes:
    a substantially longitudinally extending channel for receiving a top edge of said module board.

10. A module adapter, comprising:
    a first connector for connection to a first side of a module board and configured to be at least partially received in a module socket;
    a second connector for connection to a second side of the module board and configured to be at least partially received in the module socket, wherein said first and second connectors include a substantially longitudinally extending slot for receiving the first and second sides, respectively, of the module board;
    a first portion configured to be received in an industry standard module socket and a second portion extending above said first portion; and
    a cross-member depending from and extending between said first and second connectors.

11. The module adapter of claim 10, wherein said cross-member includes:
    a longitudinally extending slot configured to receive a top edge of the module board.

12. The module adapter of claim 10, further including:
    a first side wall depending from and extending between said first and second connectors, said first side wall at least partially exposing a module board contained within said module adapter for attachment of the module board to a socket.

13. The module adapter of claim 12, further including:
    at least one retaining member on each of said first and second connectors for retaining the module board to said module adapter.

14. The module adapter of claim 13, wherein said at least one retaining member substantially longitudinally extends along a length of each of said first and second connectors.

15. The module adapter of claim 13, wherein said at least one retaining member includes at least one protrusion.

16. A memory module adapter for connecting a module board having a plurality of sides to a module socket of another board, said memory module adapter comprising:
    a first connector for connection to a first side of said plurality of sides of said module board, said first connector configured to be at least partially received in said module socket of said another board;

a second connector for connection to a second side of said plurality of sides of said module board, said second connector configured to be at least partially received in said module socket of said another board, wherein said first and second connectors each includes a substantially longitudinally extending slot for respectively receiving the first and second sides of said plurality of sides of said module board and each including a first portion configured to be received in a predetermined shape module socket and a second portion extending above said first portion; and a cross-member depending from and extending between said first and second connectors.

17. The memory module adapter of claim 16, wherein said cross-member includes a longitudinally extending slot configured to receive a top edge of said module board.

18. The memory module adapter of claim 16, further including:

a first side wall depending from and extending between said first and second connectors, said first side wall at least partially exposing said module board contained within said module adapter for attachment of said module board to said module socket of said another board; and at least one retaining member on each of said first and second connectors for retaining said module board to said memory module adapter.

19. The memory module adapter of claim 18, wherein said at least one retaining member includes at least one protrusion.

20. A memory module adapter for connecting a module board having a plurality of sides to an industry-standard module socket of another board, said memory module adapter comprising:

a holder configured to be at least partially received in said industry-standard module socket of said another board, said module board positioned within said holder, said holder including at least one cross-member depending from and extending between a first connector and a second connector, said first connector and said second connector being structured unitarily; and at least one memory chip attached to said module board.

21. The memory module adapter of claim 20, wherein said at least one cross-member includes:

a substantially longitudinally extending channel for receiving a top edge of said module board.

22. A memory module adapter, comprising:

a first connector for connection to a first side of a module board and configured to be at least partially received in a module socket; and a second connector for connection to a second side of the module board and configured to be at least partially received in the module socket, said first connector and said second connector being structured unitarily.

23. The memory module adapter of claim 22, further including:

a cross-member depending from and extending between said first and second connectors.

24. The memory module adapter of claim 23, wherein said cross-member includes:

a longitudinally extending slot configured to receive a top edge of the module board.

25. The memory module adapter of claim 22, further including:

a first side wall depending from and extending between said first and second connectors, said first side wall at least partially exposing a module board contained within said module adapter for attachment of the module board to a predetermined shape socket.

26. The memory module adapter of claim 25, further including:

at least one retaining member on each of said first and second connectors for retaining the module board to said memory module adapter.

27. The memory module adapter of claim 26, wherein said at least one retaining member substantially longitudinally extends along a length of each of said first and second connectors.

28. A memory module configured to be connected to a predetermined shape module socket, comprising:

a holder configured to be at least partially received in said predetermined shape module socket, said holder including at least one cross-member depending from and extending between a first connector and a second connector, said first connector and said second connector being structured unitarily;

a module board positioned within said holder; and at least one memory chip attached to said module board.

29. The memory module of claim 28, wherein said at least one cross-member includes a substantially longitudinally extending channel for receiving a top edge of said module board.

30. A module adapter for connecting a module board having a plurality of sides to a module socket of another board, said another board connected to a computer, said module adapter comprising:

a first connector for connection to a first side of said plurality of sides of said module board, said first connector configured to be at least partially received in said module socket of said another board connected to said computer; and a second connector for connection to a second side of said plurality of sides of said module board, said second connector configured to be at least partially received in said module socket of said another board, said first connector and said second connector being structured unitarily.

31. The module adapter of claim 30, wherein said first and second connectors each includes a substantially longitudinally extending slot for respectively receiving the first and second sides of said plurality of sides of said module board.

32. The module adapter of claim 31, wherein said first and second connectors each include a first portion configured to be received in a standard module socket and a second portion extending above said first portion.

33. The module adapter of claim 32, further including:

a cross-member depending from and extending between said first and second connectors.

34. The module adapter of claim 33, wherein said cross-member includes a longitudinally extending slot configured to receive a top edge of said module board.

35. The module adapter of claim 30, further including:

a first side wall depending from and extending between said first and second connectors, said first side wall at least partially exposing said module board contained within said module adapter for attachment of said module board to said module socket of said another board.

36. The module adapter of claim 35, further including:

at least one retaining member on each of said first and second connectors for retaining said module board to said module adapter.

37. The module adapter of claim 36, wherein said at least one retaining member substantially longitudinally extends along a length of each of said first and second connectors.

38. The module adapter of claim 37, wherein said at least one retaining member includes at least one protrusion.

39. A module adapter for connecting a module board having a plurality of sides to a module socket of another board, said module adapter comprising:
- a first connector for connection to a first side of said plurality of sides of said module board, said first connector configured to be at least partially received in said module socket of said another board;
- a second connector for connection to a second side of said plurality of sides of said module board, said second connector configured to be at least partially received in said module socket of said another board; and
- a cross-member depending from and extending between said first and second connectors.

40. The module adapter of claim 39, wherein said cross-member includes a longitudinally extending slot configured to receive a top edge of said module board.

41. A memory module adapter, comprising:
- a first connector for connection to a first side of a module board and configured to be at least partially received in a module socket;
- a second connector for connection to a second side of the module board and configured to be at least partially received in the module socket; and
- a cross-member depending from and extending between said first and second connectors.

42. The memory module adapter of claim 41, wherein said cross-member includes:
- a longitudinally extending slot configured to receive a top edge of the module board.

* * * * *

UNITED STATES PATENT AND TRADEMARK OFFICE
CERTIFICATE OF CORRECTION

PATENT NO.       : 6,233,154 B1                                           Page 1 of 1
APPLICATION NO.  : 09/205872
DATED            : May 15, 2001
INVENTOR(S)      : Warren M. Farnworth and Jerrold L. King It is certified that error appears in the above-identified patent and that said Letters Patent is hereby corrected as shown below:

In the claims:
COLUMN 8,    LINE 11,    change "said holder, said bolder" to --said holder, said holder--

Signed and Sealed this

Twentieth Day of November, 2007

JON W. DUDAS
*Director of the United States Patent and Trademark Office*